(12) United States Patent
Kim (10) Patent No.: US 8,406,044 B2
(45) Date of Patent: Mar. 26, 2013

(54) WRITE DRIVER, SEMICONDUCTOR MEMORY APPARATUS USING THE SAME AND PROGRAMMING METHOD

(75) Inventor: Soo Gil Kim, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 101 days.

(21) Appl. No.: 12/962,908

(22) Filed: Dec. 8, 2010

(65) Prior Publication Data

US 2012/0057402 A1 Mar. 8, 2012

(30) Foreign Application Priority Data

Sep. 3, 2010 (KR) .................. 10-2010-0086667

(51) Int. Cl.
*G11C 11/00* (2006.01)
(52) U.S. Cl. .................. 365/163; 365/148; 365/189.05
(58) Field of Classification Search .................. 365/163, 365/148, 189.05, 230.06
See application file for complete search history.

(56) References Cited

U.S. PATENT DOCUMENTS

| 7,486,536 B2 | 2/2009 | Kim et al. | |
| 7,864,619 B2* | 1/2011 | Cho et al. | 365/163 |
| 7,907,437 B2* | 3/2011 | Lee et al. | 365/148 |
| 8,134,857 B2* | 3/2012 | Lin et al. | 365/148 |

FOREIGN PATENT DOCUMENTS

| KR | 1020050030204 | 3/2005 |
| KR | 1020090010598 | 1/2009 |
| KR | 1020090040289 | 5/2009 |
| KR | 1020090100077 | 9/2009 |
| KR | 1020090123244 | 12/2009 |

* cited by examiner

*Primary Examiner* — David Lam
(74) *Attorney, Agent, or Firm* — IP & T Group LLP (57) ABSTRACT

A write driver, a semiconductor memory apparatus using the same, and a programming method. The write driver includes a reset control unit configured to output a first current pulse for a first period of time and subsequently output a second current pulse having a higher current level than the first current pulse for a second period of time to a memory cell array in response to a reset program command.

20 Claims, 9 Drawing Sheets

WRITE DRIVER, SEMICONDUCTOR MEMORY APPARATUS USING THE SAME AND PROGRAMMING METHOD

CROSS-REFERENCES TO RELATED APPLICATION

The present application claims priority under 35 U.S.C. 119(a) to Korean application number 10-2010-0086667, filed on Sep. 3, 2010, in the Korean Patent Office, which is incorporated by reference in its entirety as if set forth in full.

BACKGROUND

1. Technical Field

The exemplary embodiment of the present invention relates to a write driver, a semiconductor memory apparatus using the same and a programming method.

2. Related Art

Phase-change random access memories (PCRAMs) which are a kind of non-volatile semiconductor memory devices, program data by applying a current to the memory devices. The PCRAMs have drawn attention by being able to provide performance better than DRAMs in terms of speed and a number of rewrites allowed.

Figure 1:
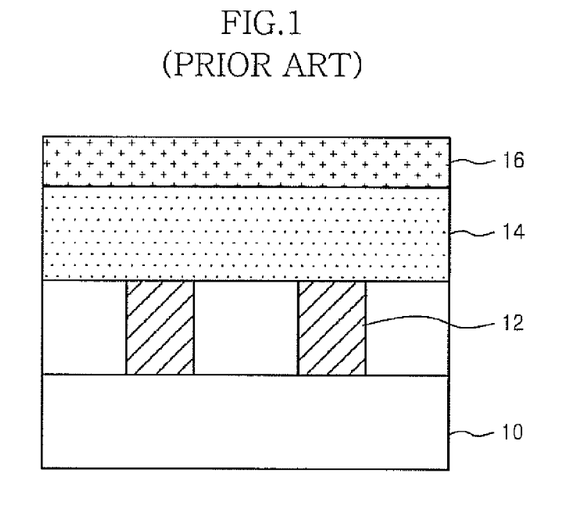
FIG. 1 is a cross-sectional view of a conventional phase-change memory device.

FIG. 1 is a cross-sectional view of a conventional phase-change memory device.

Referring to FIG. 1, a phase-change memory device may include a semiconductor substrate 10 in which a bottom structure such as a switching device, or the like (not shown) is formed, a lower electrode 12 formed on the semiconductor substrate 10, a phase-change material layer 14 formed on the lower electrode 12, and an upper electrode 16 formed on the phase-change material layer 14.

The phase-change material layer is to be heated at a temperature above a melting point to place a phase-change memory cell in a reset state (e.g., an amorphous state). At this time, as illustrated in FIG. 2, a reset current of a simple square wave is applied for a time of about several hundred ns.

More specifically, a high current is applied continuously for a long time to reset a memory cell into the reset state. Here, heat generated at a cell to be programmed may transfer to an adjacent memory cell. At this time, the transferred heat may cause a disturbance in the adjacent cell to change its state.

Figure 3:
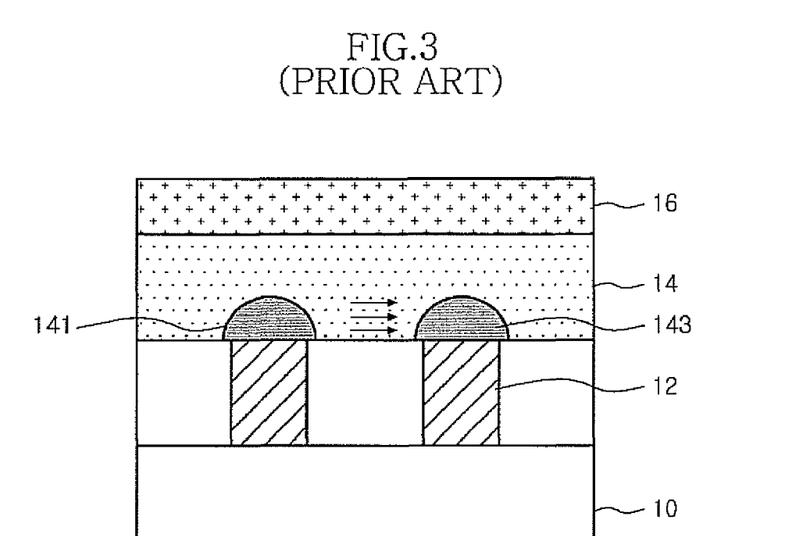
FIG. 3 is a diagram illustrating disturbance in a phase-change memory device.

FIG. 3 is a diagram illustrating such a disturbance in resetting of a phase-change memory device.

Figure 2:
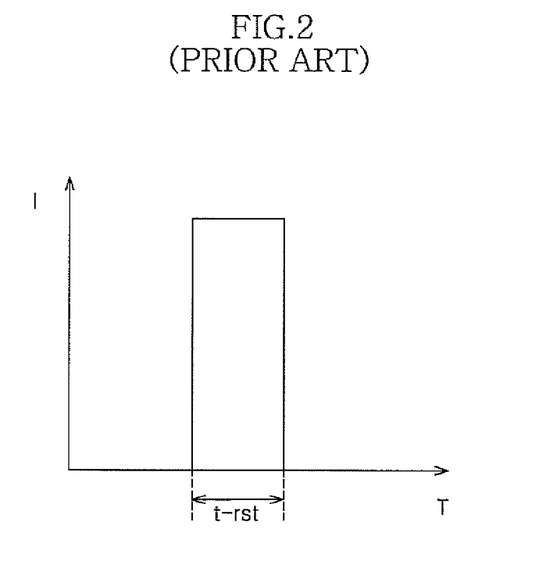
FIG. 2 is a diagram illustrating a profile of a reset pulse in a conventional phase-change memory device.

A reset current having a profile shown in FIG. 2 is applied to the phase-change material layer 14 on a left-side lower electrode to make the phase-change material layer 14 to be in an amorphous state. The reference numeral 141 indicates an area having an amorphous state after applying the reset current.

However, when the reset current is applied to program the left-side cell, the accompanying heat may also be transferred to a phase-change material layer 14 on a right-side lower electrode. If the right-side cell is in the reset state, the transferred heat may cause an amorphous area 143 of the right-side cell to change into the crystalline state unintentionally.

Because of such features, a method which limits the reset current and shortens a reset current applying time have been considered.

Figure 4:
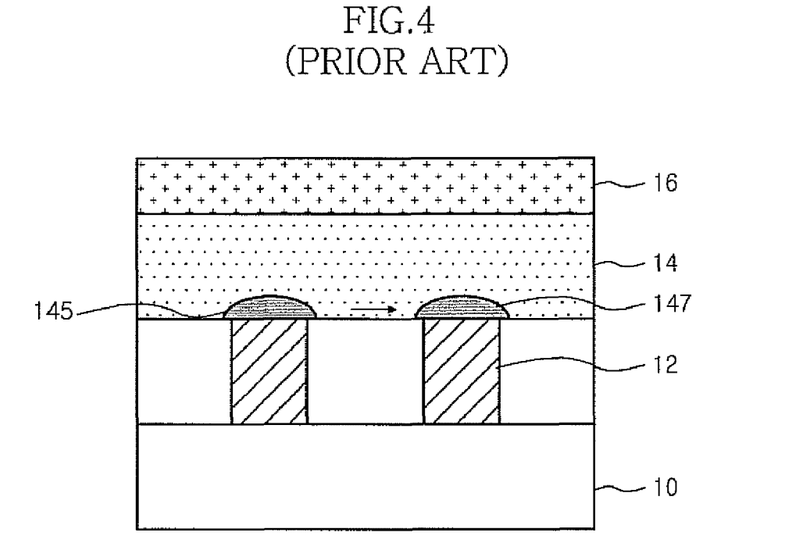
FIG. 4 is a diagram illustrating operation characteristic of a phase-change memory device according to reduction of a reset pulse applying time.

FIG. 4 is a diagram illustrating an operation characteristic of the phase-change memory device where the reset pulse applying time has been reduced.

In the case where a reset pulse is applied for a short period time ranging from about 10 to 30 ns so as to prevent a disturbance causing unintended memory device state changes, any disturbance on adjacent cells can be reduced/minimized. However, the phase-change material layer may not be heated for a sufficient time and thus smaller amorphous areas 145 and 147 may result in a smaller reset resistance. Here, the reduction in the reset resistance causes a reset margin to be reduced for each cell where low heat generated at the cell may cause the stored data to be easily lost and thus degrade the operation reliability of a semiconductor memory device.

Figure 5:
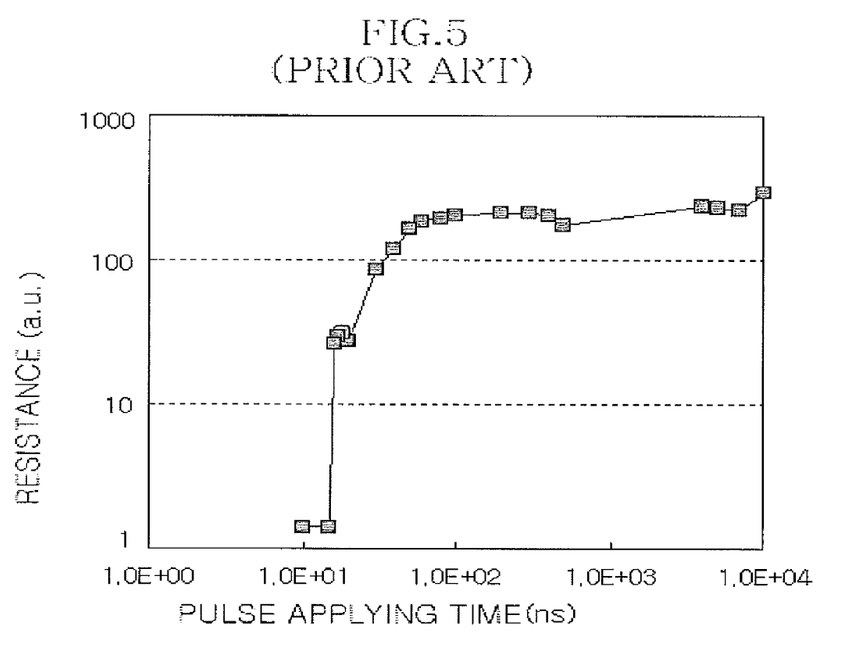
FIG. 5 is a graph illustrating a correlation between a reset pulse applying time and a reset resistance.

FIG. 5 is a graph illustrating a correlation between the reset pulse applying time and the reset resistance.

As illustrated in FIG. 5, the reset resistance becomes lowered as the reset pulse applying time becomes shorter. Here, the phase-change material layer is desired to be heated for a sufficient time enough for the subject phase-change memory cell to enter the reset state while not causing unintended degradation in states of the adjacent cells.

SUMMARY

According to an aspect of an exemplary embodiment, a write driver includes a reset control unit configured to output a first current pulse for a first period of time and subsequently output a second current pulse having a higher current level than the first current pulse for a second period of time to a memory cell array in response to a reset program command.

According to another aspect of another exemplary embodiment, a semiconductor memory apparatus for storing data in a memory cell by applying current includes a command control unit configured to output a set program command and a reset program command by inputting a program command and the data, a write driver configured to generate a set pulse for set program in response to the set program command, output a first current pulse as a reset pulse for a first period of time, and subsequently output a second current pulse having a higher current level than the first current pulse as the reset pulse for a second period of time in response to the reset program command, and a memory cell array configured to store the data in response to the set pulse or the reset pulse output from the write driver.

According to another aspect of another exemplary embodiment, a programming method of a semiconductor memory apparatus which stores data in a memory cell by applying current includes outputting a first current pulse to the memory cell for a first period of time and outputting a second current pulse having a higher current level than the first current pulse to the memory cell for a second period of time subsequent to the first period of time to the memory cell in response to a reset program command.

These and other features, aspects, and embodiments are described below in the section entitled "DESCRIPTION OF EXEMPLARY EMBODIMENT."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EXEMPLARY EMBODIMENT

Exemplary embodiments are described herein with reference to drawings of exemplary embodiments (and intermediate structures). Here, The drawings are not necessarily to scale and in some instances, proportions may have been exaggerated in order to clearly illustrate features of the embodiments. Exemplary embodiments should not be construed as limited to illustrated shapes and include other reasonably suitable shapes. Throughout the disclosure, like reference numerals refer to like parts throughout the various figures and embodiments of the present invention. When a first layer is referred to as being "on" a second layer or "on" a substrate, it not only refers to a case where the first layer is formed directly on the second layer or the substrate but also a case where a third layer exists between the first layer and the second layer or the substrate.

The exemplary embodiments of the present invention are applicable to all reasonably suitable types of semiconductor memory apparatuses which program data by applying a current to a memory device. However, hereinafter, a phase-change memory device will be exemplarily explained.

Hereinafter, the exemplary embodiments of the present invention will be explained in more detail with reference to the drawings.

Figure 6:
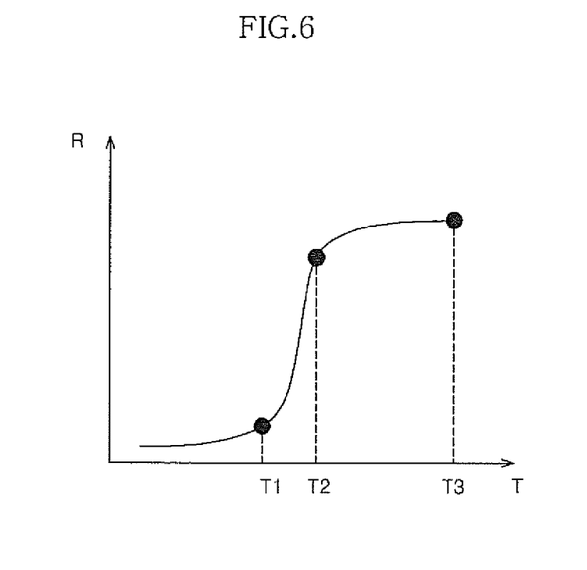
FIG. 6 is a diagram illustrating resistance variation of a phase-change material layer according to a reset current.

FIG. 6 is a diagram illustrating resistance variation of a phase-change material layer when applying a reset current.

If a reset current of a simple square wave (for example, the reset current of the profile as illustrated in FIG. 2) is continuously applied to the phase-change material layer which determines a state of a cell in a phase-change memory device for a long time, the phase-change material layer is phase-changed corresponding to different amplitudes of the applied reset current as illustrated in FIG. 6.

That is, the phase-change material layer starts to melt at a first time T1 so that the phase-change material layer starts to be amorphous, and at this time, the phase-change material layer still has a low resistance.

When the reset current is consistently applied and it arrives at a second time P2, the phase-change material layer has a resistance close to a reset state. If the reset current is applied until a third time P3, the phase-change material layer has a resistance sufficient enough to be in the reset state.

That is, an interval between the first time T1 and the second time T2 may be regarded as a period in which amorphization of the phase-change material layer is being accelerated and an interval between the second time T2 and the third time T3 may be regarded as a period that the phase-change material layer is being set in the amorphous state (that is, an actual programming period).

Here, according to an exemplary embodiment, the phase-change material layer is preheated to accelerate the amorphization of the phase-change material layer by applying a low current for a sufficient time between the first time T1 to the second time T2 and resets the phase-change material layer to be in the amorphous state by applying a high current for a short time from the second time T2 to the third time T3 where the resistance of the phase-change material layer varies in response to the reset current.

Here, an interval for pre-heating the phase-change material layer is referred to as a pre-heating period and an interval for resetting the phase-change material layer to be in an amorphous state is referred to as a programming period.

Moreover, in the pre-heating period, a current of a fixed level may be applied or a current with at least a step increase during the period may be applied. Even with such variances between types of current applied in the pre-heating period, the reset current according to an exemplary embodiment may commonly include a pulse supplied in the pre-heating period and a pulse supplied in the programming period where the reset current is referred to as a stepped pulse.

A write driver generating the reset current will be described in more detail as follows.

Figure 7:
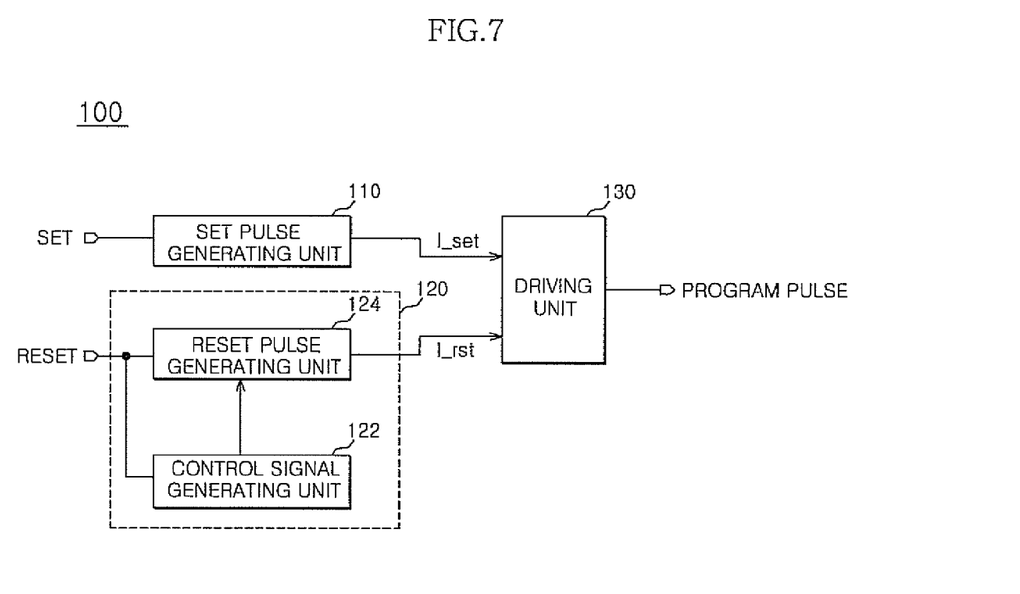
FIG. 7 is a configuration diagram of a write driver in accordance with exemplary embodiments of the present invention.

FIG. 7 is a configuration diagram of a write driver in accordance with embodiments of the present invention.

Referring to FIG. 7, a write driver 100 according to embodiments of the present invention includes a set pulse generating unit 110, a reset control unit 120, and a driving unit 130.

The set pulse generating unit 110 outputs a set pulse I_set to enable a transition of a phase-change memory device to a set state in response to a set program command SET. The set pulse I_set is output as a slow quench wave or a rectangular wave. The set pulse generating unit 110 may be configured as any reasonably suitable pulse generating unit that generates a slow quench wave or a rectangular wave.

The reset control unit 120 outputs a reset pulse I_rst to enable a transition of the phase-change memory device to a reset state (e.g., an amorphous state of a subject memory cell) in response to a reset program command RESET. Here, the reset pulse I_rst may be a pulse type having a current level that is sequentially increased. More specifically, the reset pulse I_rst includes a first pulse for pre-heating a phase-change material layer and a second pulse with a higher current level than the first pulse for programming the phase-change material layer in a reset state.

Here, the reset control unit 120 includes a control signal generating unit 122 and a reset pulse generating unit 124. The control signal generating unit 122 generates a control signal for sequentially increasing the level of the reset pulse and provides it to the reset pulse generating unit 124. The control signal may be a digital code and may be set/stored prior to being output as the control signal. The reset pulse generating unit 124 receives the control signal output from the control signal generating unit 122 and outputs the reset pulse I_rst of which the current level is sequentially increased at a desired time in response to the reset program command RESET.

The driving unit 130 outputs the output signal I_set of the set pulse generating unit 110 and the output signal I_rst of the reset control unit 120 as a program pulse to a memory cell array.

Figure 8:
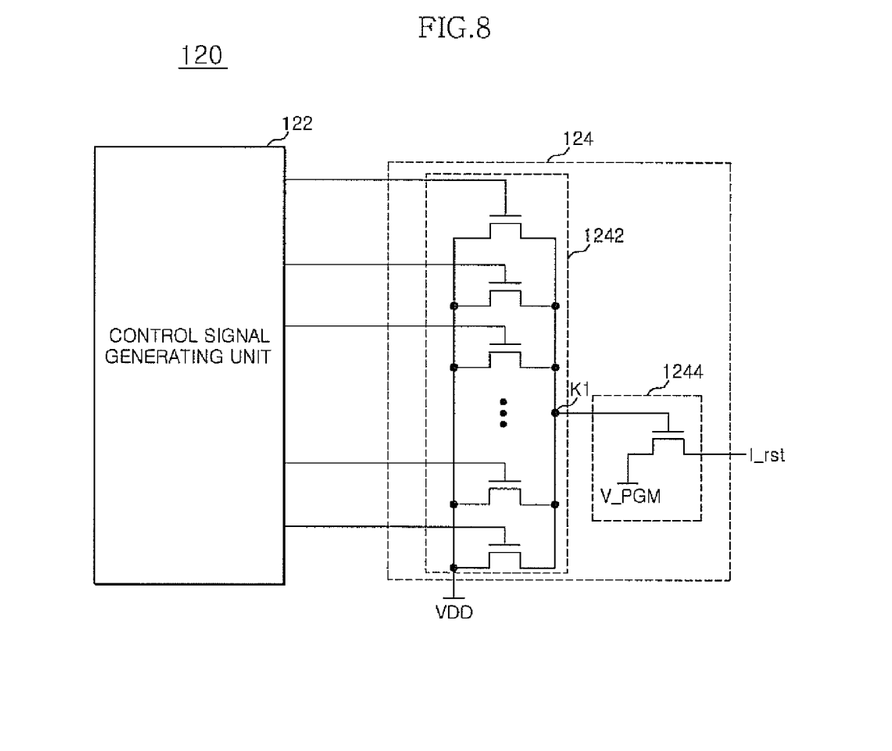
FIG. 8 is a configuration diagram of a reset control unit of FIG. 7.

FIG. 8 is a configuration diagram of the reset control unit of FIG. 7.

As illustrated in FIG. 8, the reset pulse generating unit 124 includes a level control unit 1242 and a pulse output unit 1244.

The level control unit 1242 may be configured by connecting a plurality of switching devices in parallel which are driven by the control signals of the digital code output from the control signal generating unit 122 and receive a power supply voltage VDD to output a control voltage to an output node K1. The control signal is applied to a gate terminal of each of the plurality of switching devices, the power supply voltage VDD is applied to a source terminal of each of the plurality of switching devices, and the output node K1 is commonly connected to drain terminals of the plurality of switching devices.

The pulse output unit 1244 is driven by the voltage at the output node K1 that is output from the level control unit 1242 and receives a program voltage V_PGM to output the reset pulse I_rst.

The control signal output from the control signal generating unit 122 may be a digital code, and the control signal controls on/off states of the switching devices constituting the level control unit 1242 according to different periods of time. If the control signal is configured to output the first pulse of a single level during the pre-heating period, the control signal which turns on a number of the switching devices constituting the level control unit 1242 in the pre-heating period is output. In the programming period, the control signal is configured to turn on a number of switching devices higher than a number of switching devices which are turned on in the pre-heating period. The number of the switching devices which are turned on in the programming period is controlled to change the phase-change material sufficiently to have a desired resistance.

In another example, in the case where the control signal is configured to sequentially increase the current level of the first pulse in the pre-heating period, a number of the switching devices which are turned on are gradually increased at each desired time so that a voltage which is gradually increased can be applied to the output node K1. A number of switching devices that are turned on in the programming period is to be more than a total number of switching devices that are turned on in the pre-heating period. A number of the switching devices which are turned on in the programming period is to be controlled to melt the phase-change material sufficiently to have a desired resistance.

In this way, the control voltage applied to the gate terminal of the switching device constituting the pulse output unit 1244 become higher in the programming period than in the pre-heating period such that the reset pulse I_rst has a stepped pulse type.

In addition, if the reset operation is terminated (that is, if the reset program command RESET is disabled), the control signal is controlled to turn off all the switching devices of the level control unit 1242.

Figure 9A:
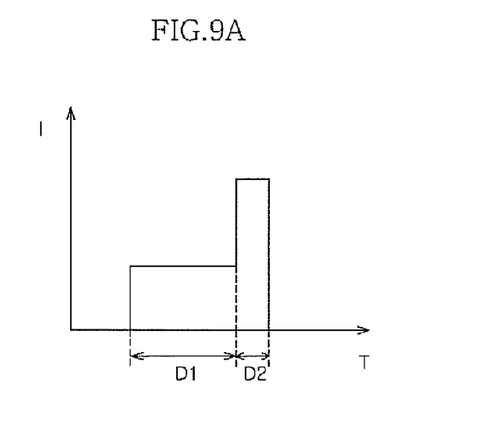
FIGS. 9a and 9b are diagrams explaining examples of profiles of reset pulses according to exemplary embodiments of the present invention.
Figure 9B:
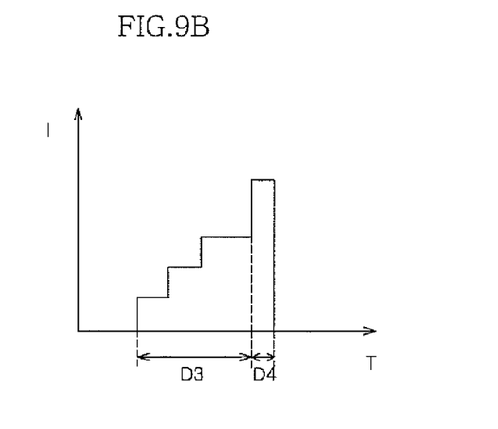

FIGS. 9A and 9B are diagrams explaining profiles of reset pulses according to an exemplary embodiment of the invention.

First, FIG. 9A indicates the reset pulse in the case of outputting a first pulse of a single current level (that is, a single current level of the reset pulse I_rst) in the pre-heating period and a second pulse in the programming period.

During a pre-heating period D1, portions of the switching devices of the level control unit 1242 are turned on to output the first pulse of a first current level as the reset pulse. In addition, during a previously set programming period D2, a number of switching devices in the programming period that is larger than a number of switching devices which are turned on in the pre-heating period are turned on to output the second pulse of a second current level higher than the first current level as the reset pulse.

FIG. 9B indicates the reset pulse in the case of outputting the first pulse of which the current level is sequentially increased in the pre-heating period and the second pulse in the programming period.

A number of switching devices which are turned on are sequentially increased to raise the current level of the first pulse during the pre-heating period D3. The second pulse which actually programs the phase-change material layer is output during the programming period D4.

Although the first pulse of any type may be output in pre-heating period, the first pulse may be set to have a minimum current level equal to or greater than current level at which the phase-change material layer starts to melt, that is, a current level at which the resistance starts to rise. On the other and, the maximum current level may be set lower than a current level which causes the disturbance of the adjacent memory cell. Here, since in the pre-heating period at which the first pulse is supplied, the phase-change material layer does not affect the disturbance of the adjacent memory cell while melting, the first pulse during above several hundred ns may be supplied for a sufficient time ranging from 10 ns to 900 ns. When the first pulse of which the current level sequentially increased in the pre-heating period is applied, a pulse supplying time in each of sequential steps may be set between several ns and several hundreds ns.

In addition, the programming period is determined to be a time not long enough to cause the disturbance of the adjacent memory cell. In one embodiment of the present invention, the programming period may be performed for 10 to 100 ns.

Figure 10:
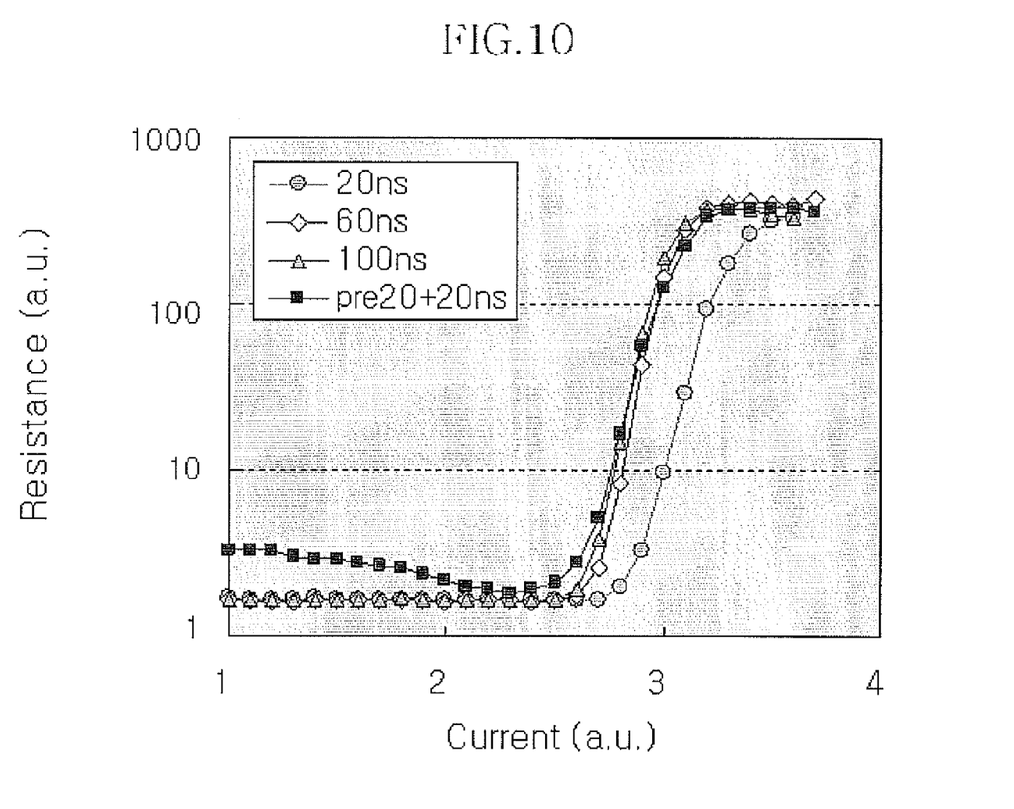
FIGS. 10 and 11 are graphs explaining correlations between a reset pulse profile and reset resistance.
Figure 11:
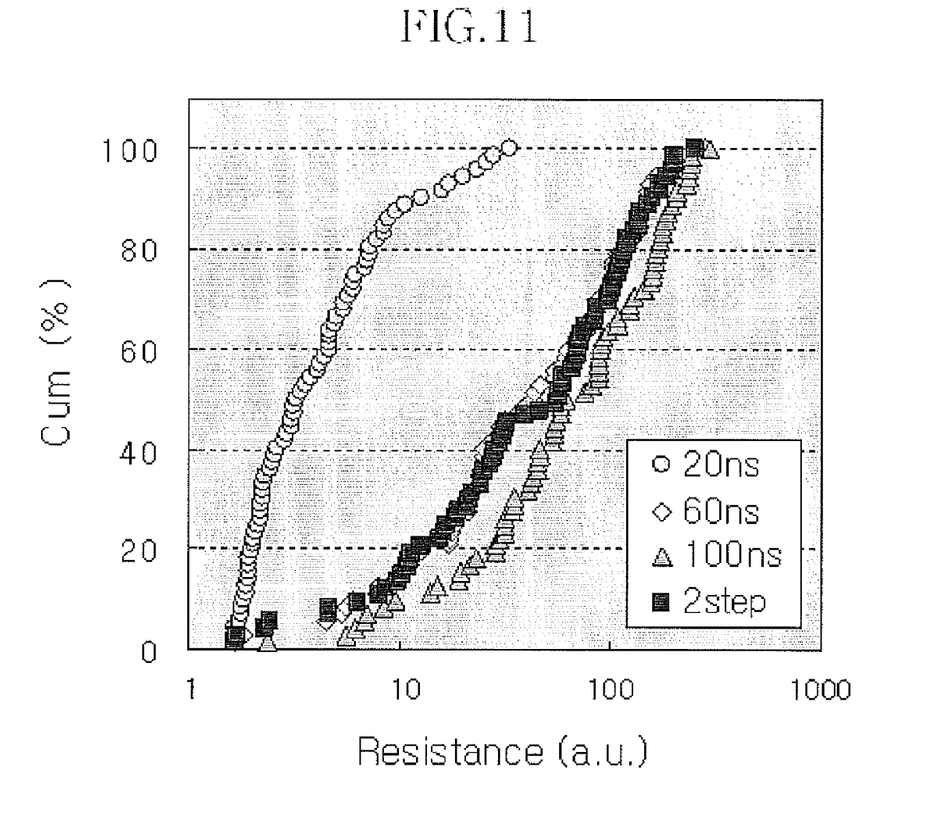

FIGS. 10 and 11 are graphs explaining correlations between a reset pulse profile and a reset resistance.

First, FIG. 10 indicates resistance variations in the cases where the reset pulse of the simple square wave is applied for 20 ns, 60 ns, and 100 ns, respectively to perform the program and in the case where a step pulse which includes a pre-heating period of 20 ns and a programming period of 20 ns is applied to perform the program.

It is known that when the reset pulse of the simple square wave is applied for a short time of 20 ns, a sufficient reset resistance can not be ensured.

In the case where the reset pulse of the simple square wave is applied for 60 ns and 100 ns, the reset resistance can be sufficiently ensured, but the disturbance effect for the adjacent memory cell may not be prevented/reduced.

When the reset program is performed by applying the step pulse as in an exemplary embodiment of the present invention, total of 40 ns for applying the step pulse may be used and the disturbance effect for the adjacent memory cell can be prevented/reduced while obtaining the reset resistance almost similar to that in the case where the program is performed by supplying the reset current of the simple square wave for 100 ns.

FIG. 11 is a graph comparing a resistance distribution rate Cum in the case where the reset pulse of the simple square wave is applied for 20 ns, 60 ns, and 100 ns, respectively to perform the program with that in the case where the step pulse having two steps is applied to perform the program. The resistance distribution rate Cumin the case where the step pulse of two steps is applied is illustrated to be almost similar to that in the case where the reset pulse of the simple square is applied for 100 ns.

Figure 12:
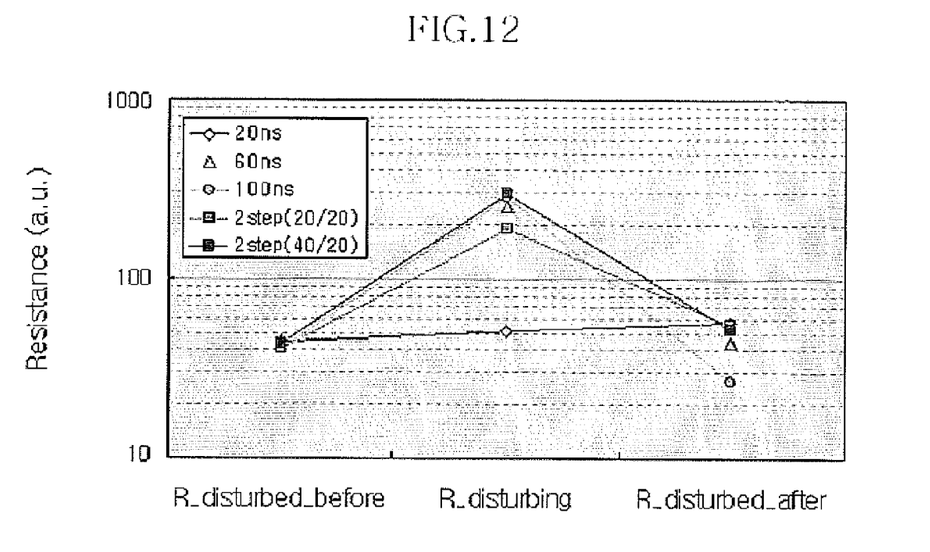
FIG. 12 is a graph illustrating a disturbance effect according to a reset pulse profile.

FIG. 12 is a graph illustrating an effect of disturbance t according to a reset pulse profile.

FIG. 12 indicates the resistance variation for a memory cell adjacent to a memory cell in which the program is performed.

In the case where the reset pulse of the simple square wave is applied for 20 ns, the resistance of adjacent memory cell is maintained as is before the program, during the program, and after the program so that the adjacent memory cell is free from the disturbance effect. However, in this case, reduction in the reset margin due to the low reset resistance of the adjacent memory cell is maintained to be the same as described above.

In the case where the reset pulse of the simple square wave is applied for 60 ns, the reset resistance of the adjacent memory may decrease slightly after the program to undergo the disturbance effect. In the case where the reset pulse of the simple square wave is applied for 100 ns, the reset resistance of the adjacent memory cell is drastically reduced after the program of the programmed memory. That is, the adjacent memory cell is phase-changed from an amorphous state to a crystalline state by the disturbance effect.

However, when the reset pulse of a step pulse type is applied in two steps according to an exemplary embodiment of the present invention, in all the cases where the pre-heating period and the programming period are controlled to be 20 ns or 40 ns, the resistance of the adjacent memory cell is slightly increased after the program and the reset state is maintained to be the same.

In the case where the program operation is performed by applying the step pulse according to an exemplary embodiment of the present invention, the disturbance characteristic can be drastically improved.

Figure 13:
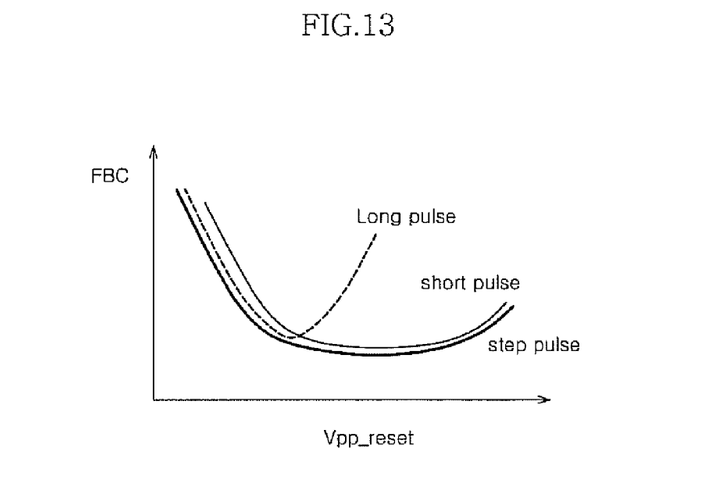
FIG. 13 is a diagram illustrating a correlation between a reset pulse profile and an operation voltage.

FIG. 13 is a diagram illustrating a correlation between the reset pulse profile and an operation voltage.

In the case where a long pulse, that is, the reset pulse of the simple square wave is applied for a long time of 100 ns, the operation voltage Vpp_reset is lowered. However, the disturbance is severe and causes an increase in a fail bit count (FBC). In the case where the reset pulse of the simple square wave (short pulse) is applied for a short time of 20 ns, the disturbance is less so that the FBC is reduced, but the operation voltage Vpp_reset is increased.

On the other hand, in the case where the step pulse is applied in the reset programming operation according to an exemplary embodiment of the present invention, the operation voltage Vpp_reset may be lowered where the disturbance occurrence is suppressed to thereby increase the operation voltage margin.

Figure 14:
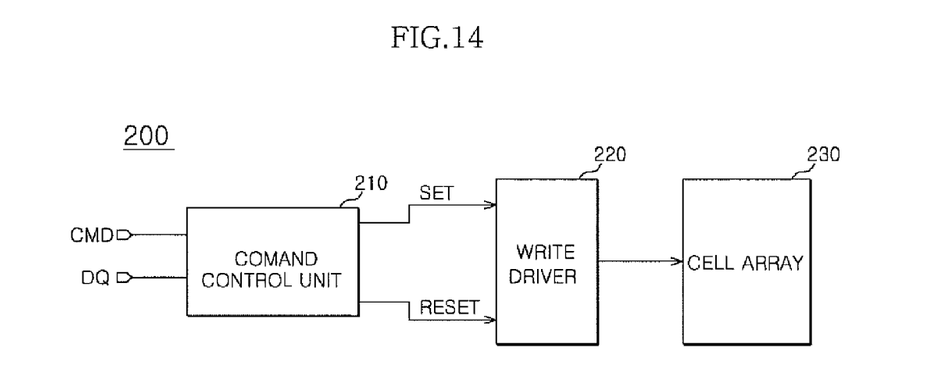
FIG. 14 is a configuration diagram of a semiconductor memory apparatus in accordance with exemplary embodiments of the present invention.

FIG. 14 is a configuration diagram of a semiconductor memory apparatus in accordance with exemplary embodiments of the present invention.

A semiconductor memory apparatus 200 according to an exemplary embodiment of the present invention is a memory apparatus which performs the programming operation by applying current to a memory such as a phase-change memory device. The semiconductor memory apparatus 200 includes a command control unit 210 configured to output a write command SET for a set operation and a write command RESET for a reset operation by inputting a write command CMD and data DQ via a data pad (not shown).

The semiconductor memory apparatus 200 includes a write driver 220 configured to generate a set pulse for set program and a reset pulse for reset program in response to the write command SET for set operation and the write command RESET for reset operation, respectively, that are output from the command control unit 210.

The program pulse (that is, set pulse or a rest pulse) output from the write driver 220 is applied to a cell array 230 to make a memory cell to be placed in a set state or a reset state.

The write driver 220 as illustrated in FIG. 14 may be configured using the write driver 100 as illustrated in FIG. 7.

More specifically, the pulse for set program is output as a slow quench wave or a rectangular wave and is generated from the set pulse generating unit 110.

In addition, the pulse for reset program has a step pulse type of which a current level is sequentially increased. More specifically, the pulse for reset program includes a first pulse for pre-heating a phase-change material layer and a second pulse for programming the phase-change material layer and is controlled so that the second pulse have a higher voltage level than the first pulse. Furthermore, the first pulse is controlled in a step pulse type of which a current level is sequentially increased or in a pulse having a single current level.

By applying the reset pulse in multiple steps, the disturbance to an adjacent cell can be prevented in the reset operation where a high current is applied. The adjacent cell can maintain a high reset resistance to thereby increase an operation voltage margin in resetting memory cells.

While certain embodiments have been described above, it will be understood that the embodiments described are by way of example only. Accordingly, the devices and methods described herein should not be limited based on the described embodiments. The systems and methods described herein are limited by claims as follows.

What is claimed is:

1. A write driver comprising a reset control unit configured to output a first current pulse for a first period of time and output a second current pulse having a higher current level than the first current pulse for a second period of time to a memory cell array in response to a reset program command,
    wherein the second current pulse is output continuously after the first current pulse.

2. The write driver of claim 1, wherein the first current pulse is a current pulse of a single level.

3. The write driver of claim 1, wherein the first current pulse is a stepped current pulse of which a current level is increased at least once during the outputting of the first current pulse.

4. The write driver of claim 1, wherein the reset control unit includes:
    a control signal generating unit configured to output a control signal determining current levels of the first current pulse and the second current pulse; and
    a reset pulse generating unit configured to receive the control signal output from the control signal generating unit and sequentially output the first current pulse and the second current pulse in response the control signal.

5. The write driver of claim 4, wherein the reset pulse generating unit includes:
    a level control unit configured to be driven by the control signal, receive a power supply voltage, and output a control voltage to an output node; and
    a pulse output unit configured to be driven by the control voltage, receive a programming voltage, and output a reset pulse that includes the first current pulse and the second current pulse.

6. The write driver of claim 5, wherein the level control unit includes a plurality of switching devices connected in parallel between a power supply terminal and a common node and configured to be driven by the control signal.

7. The write driver of claim 6, wherein the plurality of switching devices are configured to be turned off by disabling the reset program command.

8. The write driver of claim 5, wherein the control signal is a digital code.

9. The write driver of claim 1, further comprising:
a set pulse generating unit configured to output a set pulse in response to a set program command; and
a driving unit configured to provide an output signal of the set pulse generating unit or an output signal of the reset control unit as a program pulse to the memory cell array.

10. The write driver of claim 1, wherein the higher current level of the second current pulse is sufficient to reset a memory cell of the memory cell array to be in an amorphous state.

11. The write driver of claim 10, wherein the reset control unit is further configured to apply the current of the first current pulse so that the memory cell starts to reset into the amorphous state in response to the first current pulse and completes the reset after the application of the second current pulse.

12. A semiconductor memory apparatus for storing data in a memory cell by applying current, comprising:
a command control unit configured to output a set program command and a reset program command by inputting a program command and the data;
a write driver configured to generate a set pulse for set program in response to the set program command, output a first current pulse as a reset pulse for a first period of time, and output a second current pulse having a higher current level than the first current pulse as the reset pulse for a second period of time in response to the reset program command; and
a memory cell array configured to store the data in response to the set pulse and the reset pulse output from the write driver,
wherein the second current pulse is output continuously after the first current pulse.

13. The semiconductor memory apparatus of claim 12, wherein the write driver includes:
a set pulse generating unit configured to output the set pulse in response to the set program command;
a reset control unit configured to output the first current pulse for the first period of time and output the second current pulse for the second period of time in response to the reset program command; and
a driving unit configured to provide an output signal of the set pulse generating unit or an output signal of the reset control unit as a program pulse to the memory cell array.

14. The semiconductor memory apparatus of claim 13, wherein the reset control unit includes:
a control signal generating unit configured to output a control signal determining current levels of the first current pulse and the second current pulse; and
a reset pulse generating unit configured to receive the control signal output from the control signal generating unit and sequentially output the first current pulse and the second current pulse in response the reset program command.

15. A programming method of a semiconductor memory apparatus for storing data in a memory cell by applying current, comprising:
outputting a first current pulse for a first period of time to the memory cell in response to a reset program command; and
outputting a second current pulse having a higher current level than the first current pulse for a second period of time subsequent to the first period of time to the memory cell in response to the reset program command.

16. The method of claim 15, wherein the first current pulse is a stepped current pulse of which a current level is increased at least once during the outputting of the first current pulse.

17. The method of claim 15, wherein the semiconductor memory apparatus is a phase-semiconductor memory device and the first current pulse has a current level equal to or greater than a minimum current level at which a phase-change material layer starts to melt.

18. The method of claim 17, wherein the first current pulse has the current level less than a current level at which a disturbance to a programmed state of an adjacent memory cell occurs.

19. The method of claim 15, wherein the first period of time ranges from 10 ns to 900 ns.

20. The method of claim 15, wherein the second period of time ranges from 10 ns to 100 ns.

* * * * *

UNITED STATES PATENT AND TRADEMARK OFFICE
CERTIFICATE OF CORRECTION

PATENT NO. : 8,406,044 B2
APPLICATION NO. : 12/962908
DATED : March 26, 2013
INVENTOR(S) : Soo Gil Kim Page 1 of 1

It is certified that error appears in the above-identified patent and that said Letters Patent is hereby corrected as shown below:

Title Page, Item (56) change the FOREIGN PATENT DOCUMENTS section as follows:

KR    1020050030294    3/2005
    KR    1020090049289    5/2009

Signed and Sealed this
Seventh Day of May, 2013

Teresa Stanek Rea
*Acting Director of the United States Patent and Trademark Office*